(12) United States Patent
Su

(10) Patent No.: US 6,999,747 B2
(45) Date of Patent: Feb. 14, 2006

(54) PASSIVE HARMONIC SWITCH MIXER

(75) Inventor: Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 403 days.

(21) Appl. No.: 10/604,018

(22) Filed: Jun. 22, 2003

(65) Prior Publication Data

US 2004/0259519 A1  Dec. 23, 2004

(51) Int. Cl.
*H04B 1/26* (2006.01)
*H04B 1/28* (2006.01)

(52) U.S. Cl. .................. 455/324; 455/333; 455/118; 327/116; 327/119

(58) Field of Classification Search ............... 455/108, 455/110, 118, 131, 313, 318, 323, 324, 326, 455/333, 334; 327/100, 113, 115, 116, 117, 327/119, 124; 375/298, 300, 302, 320, 322, 375/344
See application file for complete search history.

(56) References Cited

U.S. PATENT DOCUMENTS

| | | | |
|---|---|---|---|
| 5,589,791 A | 12/1996 | Gilbert | |
| 5,826,182 A | 10/1998 | Gilbert | |
| 6,029,059 A | 2/2000 | Bojer | |
| 6,122,497 A | 9/2000 | Gilbert | |
| 6,230,001 B1 * | 5/2001 | Wyse | 455/326 |
| 6,307,894 B1 | 10/2001 | Eidson | |
| 6,847,808 B1 * | 1/2005 | Zhou | 455/189.1 |
| 6,892,062 B1 * | 5/2005 | Lee et al. | 455/326 |
| 6,937,849 B1 * | 8/2005 | Kluge et al. | 455/333 |
| 2004/0002315 A1 * | 1/2004 | Liu | 455/313 |

* cited by examiner

*Primary Examiner*—Quochien B. Vuong
(74) *Attorney, Agent, or Firm*—Winston Hsu

(57) ABSTRACT

A passive harmonic switch mixer is shown that is immune to self mixing of the local oscillator greatly reducing leakage noise, pulling noise, and flicker noise when used in a direct conversion receiver or direct conversion transmitter circuit. The passive harmonic switch mixermixes an input signal received on an input port with an in-phase oscillator signal and a quadrature-phase oscillator signal and outputs an output signal on an output port. Because the quadrature-phase oscillator signal is the in-phase oscillator signal phase shifted by 90 Â°, the passive harmonic switch mixer operates with a local oscillator running at half the frequency of the carrier frequency of an RF signal. Additionally, because the passive harmonic switch mixer has no active components, the DC current passing through each switch device is reduced and the associated flicker noise of the mixer is also greatly reduced.

18 Claims, 7 Drawing Sheets

PASSIVE HARMONIC SWITCH MIXER

BACKGROUND OF INVENTION

1. Field of the Invention

The invention relates to a mixer, and more particularly, to a passive harmonic switch mixer for use in a direct conversion receiver or a direct conversion transmitter.

2. Description of the Prior Art

FIG. 1 shows a conventional passive mixer 10. The mixer, which is for mixing a differential RF signal pair RF+ and RF− with a differential local oscillator signal to output a differential baseband signal pair BB+ and BB−, is a very important component in communication systems. There are two types of mixers: the active mixer and the passive mixer. The conventional passive mixer 10, shown in FIG. 1, includes a first input port A and a second input port B for receiving a differential RF signal pair RF+ and RF− respectively and a first output port C and a second output port D for outputting a differential baseband signal pair BB+ and BB− respectively. A positive side capacitor 12 is connected to the node A and a negative side capacitor 22 is connected to the node B for DC isolation. The conventional passive mixer 10 includes four switch devices 14, 16, 18, 20, which are for mixing a differential RF signal RF+ and RF− with a differential local oscillator signal LO+ and LO−. The first switch device 14 selectively connects/disconnects the node A to a node C depending on the positive local oscillator signal LO+, the second switch device 16 selectively connects/disconnects the node A to a node D depending on the negative local oscillator signal LO−, the third switch device 18 selectively connects/disconnects the node B to the node C depending on the LO− signal, and the fourth switch device 20 selectively connects/disconnects the node B to the node D depending on the LO+ signal.

FIG. 2 shows a signal diagram 30 of the positive and negative local oscillator signal LO+ and LO−. The operation of the passive mixer 10 in FIG. 1 is well known to a person skilled in the art and can be summarized as repeatedly switching on and off a differential RF signal pair depending on a differential LO signal pair, which is shown in FIG. 2. The RF signal pair received on the RF port is mixed with the local oscillator signal pair received at the nodes A and B and the result of this mixing is seen as a baseband signal pair output on the nodes C and D.

In addition to the passive-type mixer circuit shown in FIG. 1, there are also various active-type mixer circuit designs well known to people skilled in the art. For example, Gilbert disclosed a conventional active-type mixer circuit design, which is commonly called the "Gilbert cell", in U.S. Pat. No. 3,241,078 and various improvements based on "Gilbert cell" are disclosed afterward. The main advantage of the active mixer is the addition of signal gain to the output signal; however, it has the disadvantage that the low frequency flicker noise problem is severe.

There are two kinds of transceiver architectures used in modern communication systems, specifically the super heterodyne system and the direct conversion system. A detailed description of the transceiver architectures is disclosed in Behzad Razavi, "RF Microelectronics", 1998, which is incorporated herein by reference.

FIG. 3 shows a typical application of a mixer circuit in a super heterodyne receiver 40, also known as an IF receiver. The super heterodyne receiver 40 includes a differential RF input port, a first band pass filter 42, a first low-noise amplifier 44, a second band pass filter 46, a first mixer 48, a first local oscillator 50, a third band pass filter 52, a second low-noise amplifier 54, a second mixer 56, a third mixer 57, a second local oscillator 58, and a 90° phase shifter 59.

The operational of the super heterodyne receiver 40 includes demodulation, carrier-frequency tuning, filtering, and amplification. An incoming RF signal is received at the RF input port, filtered by the first band pass filter 42, amplified by the low noise amplifier 44, and filtered again by the second band pass filter 46. As an example, in the case of IEEE802.11B WLAN, the first band pass filter 42, the first low-noise amplifier 44, and the second band pass filter 46 are configured for operation from 2.4 GHz to 2.48 GHz. Signals in this frequency range are amplified and allowed to pass to the first mixer 48 where they are mixed with the output from the first local oscillator 50. In the example case of 802.11B WLAN, the first local oscillator 50 operates at 2.076 GHz and the output of the first mixer 48 is at 378 MHz. In order to choose the desired channel, the output of the first mixer 48 is filtered by the third band pass filter 52, which operates as a SAW filter for channel selection. The second low noise amplifier 54 amplifies the output of the third band pass filter 52 and outputs the amplified signal to both the second mixer 56 through the I-pathway and the third mixer 57 through the Q-pathway. Both the second mixer 56 and the third mixer 57 are for mixing the amplified signal output from the second low noise amplifier 54 with the output from the second local oscillator 58. Continuing the 802.11B WLAN example, the second local oscillator 58 provides a 374 MHz local oscillator signal to the second mixer 56 directly. However, the phase of the local oscillator signal must be 90° shifted by the 90° phase shifter 59 and then input to the third mixer 57. The output of the second mixer 56 and the third mixer 57 are a differential in-phase baseband signal and a differential quadrature-phase baseband signal respectively.

In order to reduce the size, cost, and power consumption of modern communication systems, the trend in todays increasingly wireless and mobile society is to embed complete systems onto a single integrated circuit (IC). Although the super heterodyne receiver provides a well-known solution for the reception and demodulation of RF signals, its implementation requires the use of many components that are fabricated external to the IC. Specifically, due to the large area required to fabricate internal to an IC, the band pass filters 42, 46, 52 and the local oscillators 50, 58 are all external components. In this manner, the circuit design is complicated by the difficult to implement impedance-matching issues.

FIG. 4 shows a direct conversion receiver 60 according to the conventional art. By directly mixing the received RF signal with a local oscillator signal running at the same frequency with the RF signal, the baseband signal can be recovered in a single step. The direct conversion receiver 60 is also known as a zero IF receiver or a homodyne receiver and includes an input RF port connected to a band pass filter 62. The output of the band pass filter 62 is connected to a low noise amplifier 64 and the output of the low noise amplifier 44 is connected to both a first mixer 66 and a second mixer 68. A local oscillator 68 provides a local oscillator signal connected to the first mixer 66 directly. However, the phase of the local oscillator signal must be 90° shifted by the phase shifter 69 and then input to the second mixer 70. The output of the first mixer 66 and the second mixer 70 are a differential in-phase baseband signal and a differential quadrature-phase baseband signal respectively.

The operation of the direct conversion receiver 60 includes demodulation and amplification. An incoming RF signal is received at the input RF port, filtered by the band pass filter 62, and amplified by the low noise amplifier 64. Using the 802.11B WLAN example, the incoming RF signal, the band pass filter 62, and the low noise amplifier 64 operate from 2.4 GHz to 2.48 GHz. The output of the low noise amplifier 64 is connected to both the first mixer 66 and the second mixer 70. In the case of 802.11B WLAN, the local oscillator also operates at 2.4 GHz allowing direct recovery of the baseband signal on the BB port.

Although the direct conversion receiver 60 reduces the required external components to the band pass filter 62 and the local oscillator 68, additional problems are encountered. The direct conversion receiver 60 suffers from leakage noise and flicker noise problems, both reducing the overall signal to noise ratio (SNR) of the direct conversion receiver 60. A DC offset on the baseband signal output on the BB port is ultimately caused because the local oscillator operates at 2.4 GHz, which is the same with the RF signal. Therefore, the isolation between the local oscillator 68 and the inputs to the mixer 66 as well as the input to the low noise amplifier 64 is not perfect. Feed through, also referred to as leakage noise, from the local oscillator 68 to the input of the low noise amplifier 64 or the mixer 66 is mixed with the original local oscillator signal causing a DC offset voltage to appear on the baseband signal at the BB port. Additionally, flicker noise, which is caused by the input noise of a transistor logic component and is inversely proportional with frequency, reduces the signal to noise ratio seen at the output BB port.

The direct conversion receiver, as well as a direct conversion transmitter, suffer from the same leakage noise, DC offset, and flicker noise problems. The problems are due to the strong RF signal being centered at the same frequency as the local oscillator signal and a portion of this signal being leaked back to the local oscillator and injected into the mixer where it is mixed with the local oscillator signal. This injection occurs due to non-ideal isolation between the local oscillator and the amplifier. Even if careful shielding techniques are used, there is still a finite amount of radiation and or conduction of the RF output signal back to the local oscillator. In addition, the direct conversion transmitter also suffers from pulling noise resulting from the voltage variation of VDD and Ground during ON and OFF switching of the power amplifier. Pulling noise may cause serve frequency shifting of the power amplifier in the direct conversion transmitter.

SUMMARY OF INVENTION

It is therefore a primary objective of the claimed invention to provide a passive harmonic switch mixer for use with a direct conversion receiver and a direct conversion transmitter, to solve the above-mentioned DC offset, leakage noise, flicker noise, and pulling noise problems.

According to the claimed invention, a passive harmonic mixer is disclosed for outputting a differential baseband signal according to a differential RF signal received from a first input node and a second input node. The passive harmonic mixer comprises a first switch pair for selectively connecting a first input node to a first output node depending on a first differential local oscillator signal, a second switch pair for selectively connecting the first input node to a second output node depending on a second differential local oscillator signal, a third switch pair for selectively connecting a second input node to the first output node depending on the second differential local oscillator signal, and a fourth switch pair for selectively connecting the second input node to the second output node depending on the first differential local oscillator signal. The first and the second input nodes are for receiving the differential RF signal and the first and the second output node are for outputting the differential baseband signal. And the frequency of each of the first differential local oscillator signal and the second differential local oscillator signal is half of the frequency of the differential RF signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 5:
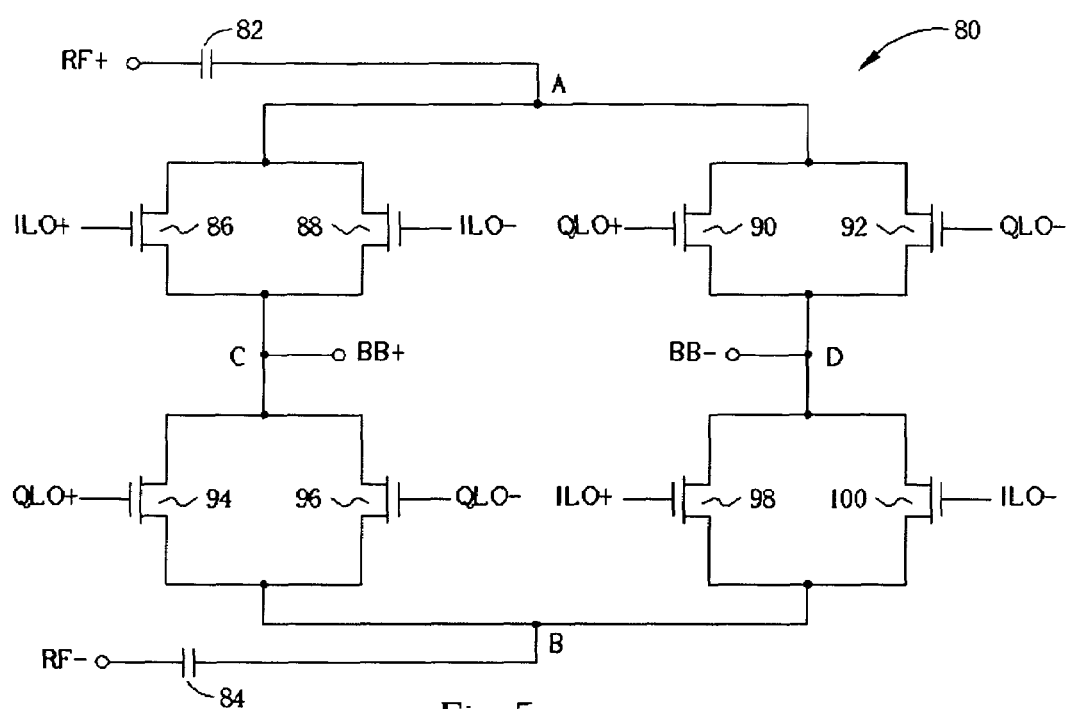
FIG. 5 is a schematic diagram of a passive harmonic switch mixer according to the embodiment of the present invention.

FIG. 5 is a schematic diagram of a passive harmonic switch mixer 80 according to the present invention. The passive harmonic switch mixer 80 includes a first input port A and a second input port B for receiving a differential RF signal pair having a positive signal RF+ and a negative signal RF− respectively. A first output port C and a second output port D are for outputting a differential baseband signal pair having a positive signal BB+ and a negative signal BB− respectively. A positive side capacitor 82 is connected to the node A and a negative capacitor 84 is connected to node B for DC isolation. There are four switch pairs for mixing the differential RF signal pair RF+ and RF− with two pairs of differential local oscillator signals, which includes an in-phase differential local oscillator signal pair ILO+ and ILO− and a quadrature-phase differential local oscillator signal pair QLO+ and QLO−, to generate a positive signal BB+ and a negative signal BB−. The first switch pair includes a first switch device 86 and a second switch device 88 to selectively connect/disconnect the node A to the node C depending on a positive and a negative in-phase differential local oscillator signal pairs ILO+ and ILO− respectively. The second switch pair includes a third switch device 90 and a fourth switch device 92 to selectively connect/disconnect the node A to the node D depending on a positive and a negative quadrature-phase differential local oscillator signal QLO+, QLO− respectively. The third switch pair includes a fifth switch device 94 and a sixth switch device 96 to selectively connect/disconnect the node B to the node C depending on the QLO+, QLO− signals respectively. The fourth switch pair includes a seventh switch device 98 and an eighth switch device 100 to selectively connect/disconnect the node B to the node D depending on the ILO+, ILO− signals respectively.

Figure 1:
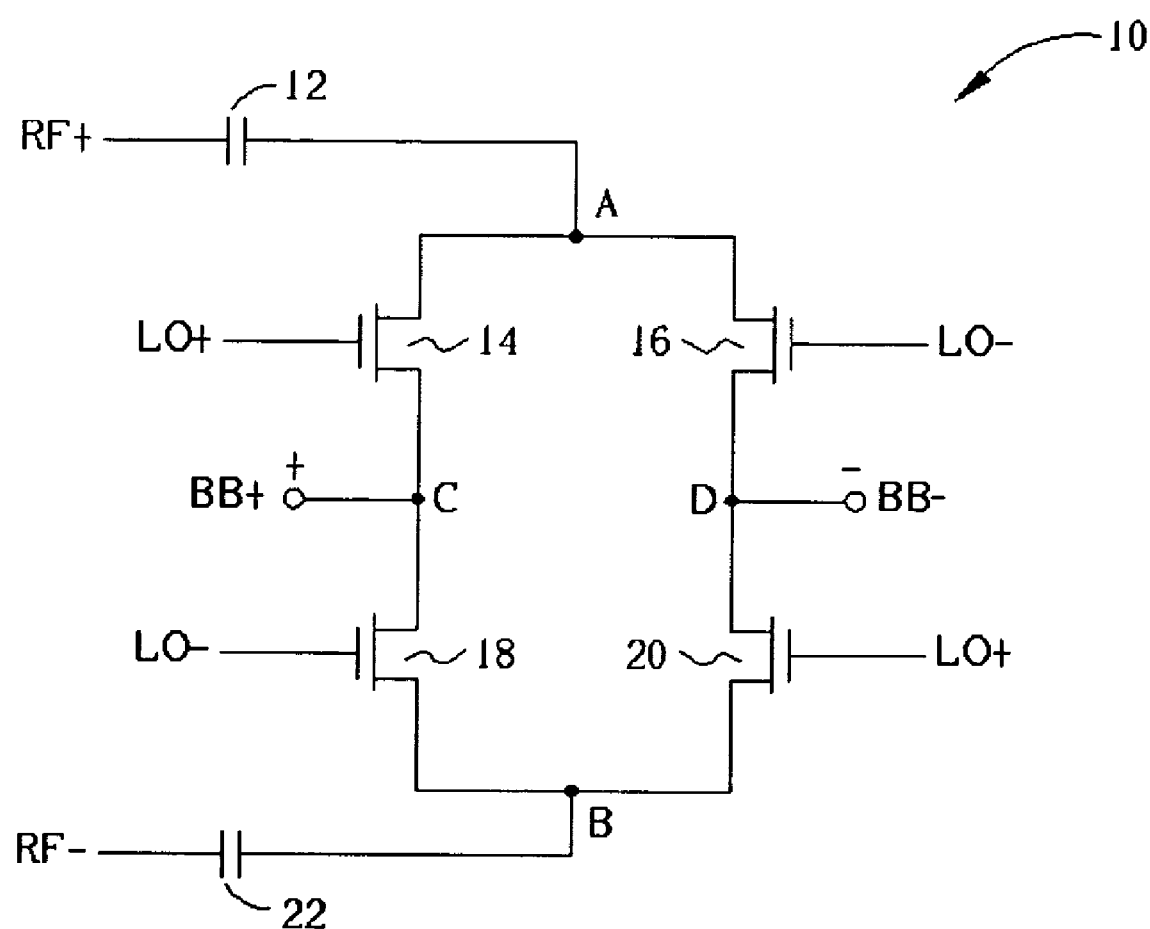
FIG. 1 is a block diagram of a conventional passive-type mixer.
Figure 2:
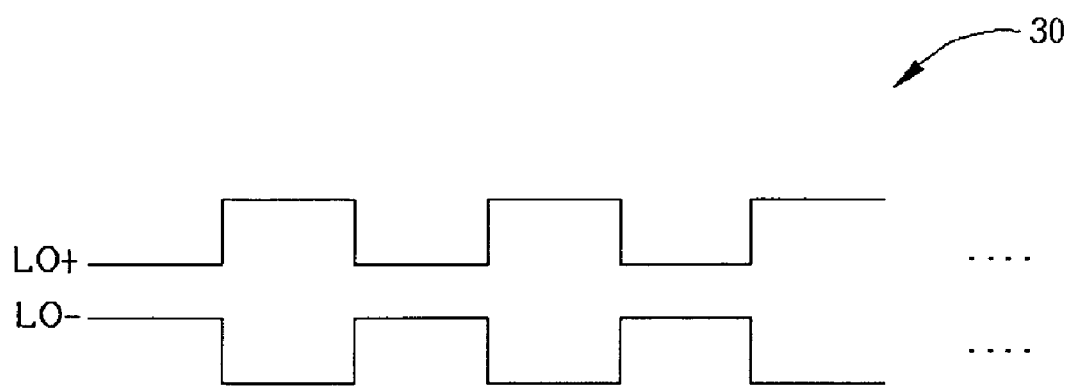
FIG. 2 is a signal diagram of the differential local oscillator signal pair of FIG. 1.
Figure 3:
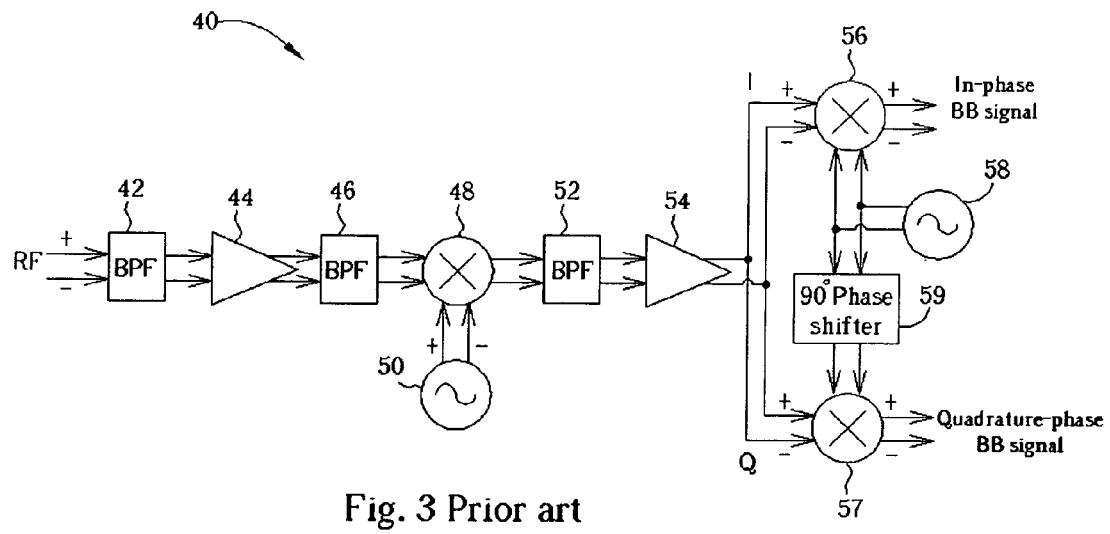
FIG. 3 is a block diagram of a super heterodyne receiver.
Figure 6:
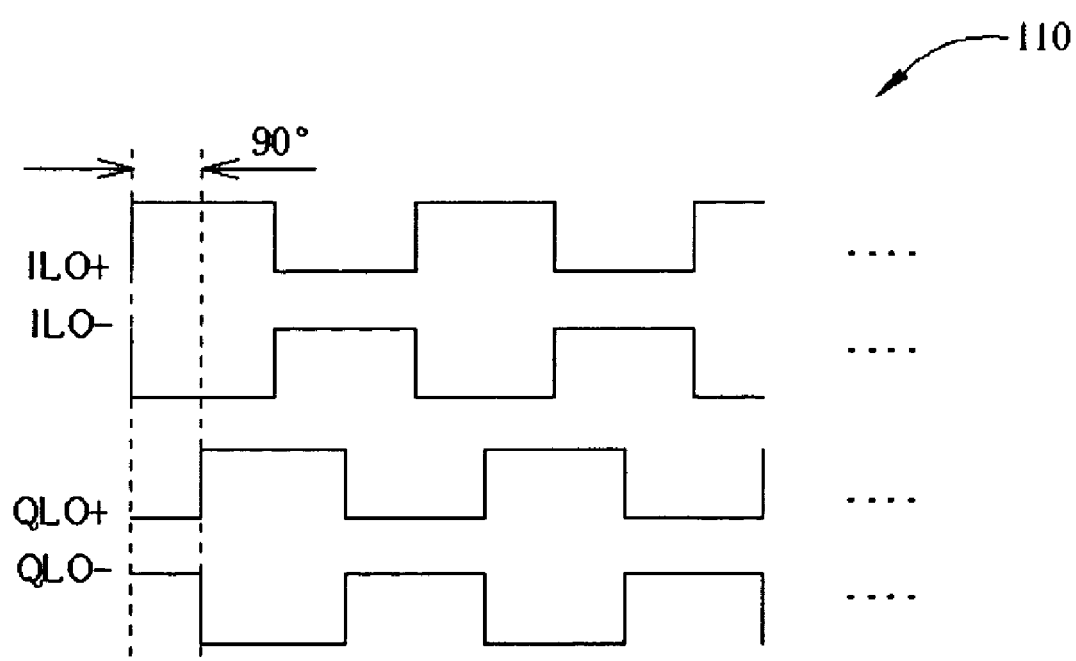
FIG. 6 is a signal diagram of the in-phase and quadrature-phase local oscillator signals of FIG. 5.

FIG. 6 shows a signal diagram 110 of the differential in-phase local oscillator signal pair ILO+ and ILO− and the differential quadrature-phase local oscillator signal pair QLO+ and QLO– for the passive harmonic switch mixer of FIG. 6. A local oscillator (not shown) generates a differential in-phase local oscillator signal pair ILO and a differential quadrature-phase local oscillator signal pair QLO, where the positive and negative quadrature-phase local oscillator signal QLO is simply the positive and the negative in-phase local oscillator signal ILO phase delayed by 90 Â° respectively. In-phase and quadrature-phase local oscillator signals are necessary in typical phase and frequency modulated signals because the two sidebands of the RF spectrum contain different information and result in irreversible corruption if they overlap each other without first being separated into two phases. In a first mode, the passive harmonic switch mixer 80 is set in a receiver for mixing the RF signal pair received on the RF port with the in-phase and quadrature-phase local oscillator signals pairs ILO, QLO and outputting the baseband signal pair from the baseband ports BB. In a second mode, the harmonic switch mixer 80 is set in a transmitter for mixing a baseband signal pair received on the BB port with the in-phase and quadrature-phase local oscillator signal pairs ILO, QLO and outputting the RF signal pair from the RF port. Because both the in-phase and quadrature-phase local oscillators signals ILO, QLO are mixed with the input signal, the passive harmonic switch mixer 80 effectively multiplies the local oscillator frequency by two when mixing the differential baseband signals. When mixing the differential RF signals, the local oscillator for the passive harmonic switch mixer 80 runs at ½ the local oscillator frequency for the typical passive switch mixer 10, shown in FIG. 1.

Figure 7:
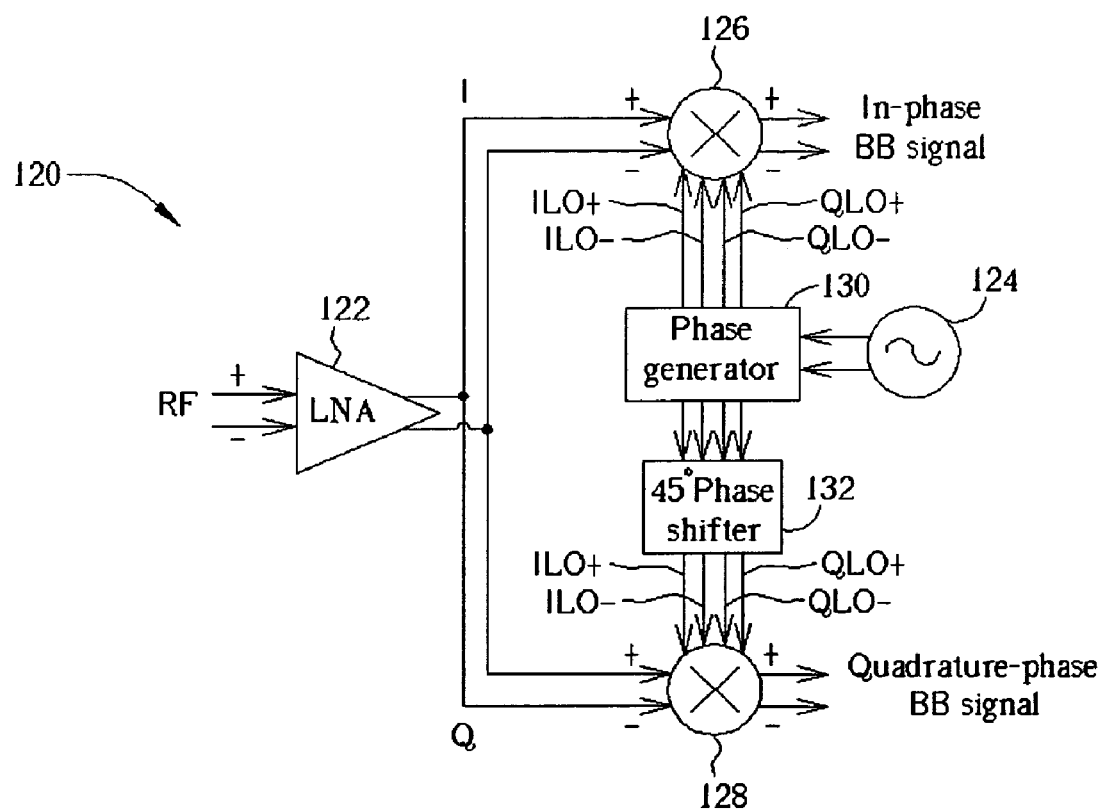
FIG. 7 is a block diagram of a direct conversion receiver implementation using the passive harmonic switch mixer of FIG. 5.

FIG. 7 shows a block diagram for a direct conversion receiver 120 using the passive harmonic switch mixer 80 of FIG. 5. The direct conversion receiver 120 includes a low noise amplifier 122, a local oscillator 124, a first passive harmonic switch mixer 126, a second passive harmonic switch mixer 128, a phase generator 130, and a 45° phase shifter 132. FIG. 7 uses an equivalent block diagram representation of the passive harmonic switch mixer. The two equivalent block diagram representations shown in FIG. 7 are used to conceptualize the functional operation of the first and the second passive harmonic switch mixer 126 and 128 and each is implemented using the passive harmonic switch mixer 80 as shown in FIG. 5. The block diagram representation shown in FIG. 7 shows the operation of the schematic diagram shown in FIG. 5.

In FIG. 7, the differential RF signal is first amplified by the low noise amplifier 122 and the amplified differential RF signal is output to the first passive harmonic switch mixer 126 and the second passive harmonic switch mixer 128. The local oscillator 124 generates the differential local oscillator signal ILO+ and ILO–, which is connected to the phase generator 130. The phase shifter 130 shifts both of the differential in-phase local oscillator signal ILO+ and ILO– by 90 Â° to form the differential quadrature-phase local oscillator signals QLO+ and QLO– respectively. The differential in-phase local oscillator signal ILO+ and ILO– and the differential quadrature-phase local oscillator signal QLO+ and QLO– are output by the phase generator 130. The phase of the in-phase local oscillator signal pair ILO+ and ILO– and the quadrature-phase local oscillator signal pair QLO+ and QLO– is as shown in FIG. 6. The amplified differential RF signal input to the first passive harmonic switch mixer 126 is mixed with both the differential in-phase and quadrature-phase local oscillator signals ILO, QLO to form a differential baseband signal at the BB port. However, the phase of the in-phase local oscillator signal pair ILO+ and ILO– and the quadrature-phase local oscillator signal pair QLO+ and QLO– are 45° shifted by the 45° phase shifter 132 and then input to the second mixer 128. The output of the first mixer 126 and the second mixer 128 are a differential in-phase baseband signal and a differential quadrature-phase baseband signal respectively.

Because both the differential in-phase and quadrature-phase local oscillator signals ILO, QLO are mixed with the RF signal, the required frequency of the local oscillator 124 is ½ of the carrier frequency of the RF signal. For an 802.11B WLAN direct conversion receiver, since the oscillating frequency of the local oscillator 124 for the passive harmonic switch mixer 80 runs at 1.2 GHz, which is different from that of the RF signal, the leakage noise and the DC offset problems of the conventional art are eliminated.

Additionally, because a passive mixer is implemented in the present invention, it has low DC current and consequently low flicker noise.

The conventional active mixer is often used in order to provide mixing with large gain. When using the passive harmonic switch mixer of the present invention, this gain requirement can be satisfied by increasing the gain of an amplifier connected in front of the mixer.

Figure 4:
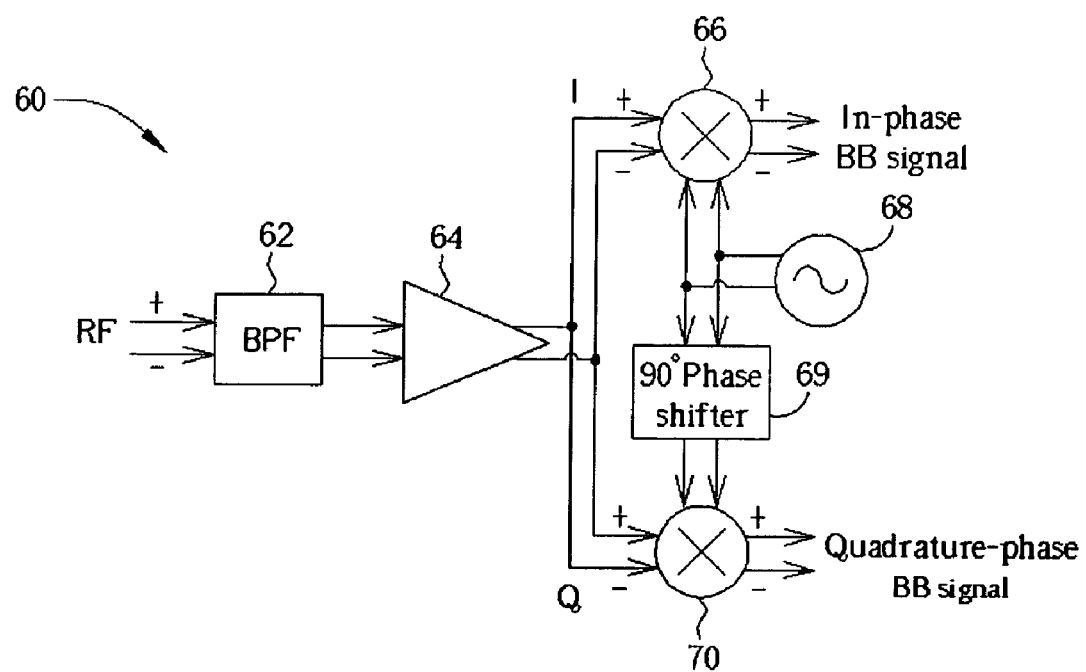
FIG. 4 is a block diagram of a direct conversion receiver.

It should be noted that the passive harmonic mixer disclosed in the present invention can be used not only in the receiver but also in the transmitter. The direct conversion receiver and transmitter according to the present invention eliminate the pulling noise problem of the conventional implementations because the differential RF signal output by the amplifier 122 is not at the same frequency as the differential local oscillator signal generated by the local oscillator 124 and is also different from both the differential in-phase and quadrature-phase local oscillator signals ILO, QLO output from the phase generator 130. In the conventional direct conversion receiver, shown in FIG. 4, the strong RF signal out of the amplifier 64 is centered at the same frequency as the local oscillator signal out of the local oscillator 68. As previously mentioned, this RF signal is mixed with the local oscillator signal. In FIG. 7, the differential RF signal is centered at a carrier frequency that is different from the frequency of the local oscillator signal and therefore eliminates the pulling noise problem as well as the leakage noise problem. When used with the direct conversion receiver, the passive harmonic switch mixer 80 also reduces the flicker noise, greatly increasing the signal to noise ratio of the output signal on the RF port.

It should also be noted that although MOS transistors are used as the switch devices throughout the diagrams of the detailed description of the preferred embodiment, this is for example only and BJT transistors are also supported by the present invention.

Additionally, the passive harmonic switch mixer can be used not only in the direct conversion transmitter/receiver, but also the super heterodyne transmitter/receiver as well.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A passive harmonic mixer for outputting a differential baseband signal according to a differential RF signal received from a first input node and a second input node, comprising:
   a first switch pair for selectively connecting a first input node to a first output node depending on a first differential local oscillator signal;

a second switch pair for selectively connecting the first input node to a second output node depending on a second differential local oscillator signal;

a third switch pair for selectively connecting a second input node to the first output node depending on the second differential local oscillator signal; and a fourth switch pair for selectively connecting the second input node to the second output node depending on the first differential local oscillator signal;

wherein the first and the second input nodes are for receiving the differential RF signal and the first and the second output node are for outputting the differential baseband signal;

wherein the frequency of each of the first differential local oscillator signal and the second differential local oscillator signal is half of the frequency of the differential RF signal;

wherein the phase of the first differential local oscillator signal and that of the second differential local oscillator signal are shifted by 90 degrees.

2. The passive harmonic switch mixer of claim 1 wherein the first differential local oscillator signal includes a positive in-phase local oscillator signal and a negative in-phase local oscillator signal and the second differential local oscillator signal includes a positive quadrature-phase local oscillator signal and a negative quadrature-phase local oscillator signal.

3. The passive harmonic switch mixer of claim 2 wherein the first switch pair includes a first switch for selectively connecting the first input node to the first output node depending on the positive in-phase local oscillator signal and a second switch for selectively connecting the first input node to the first output node depending on the negative in-phase local oscillator signal.

4. The passive harmonic switch mixer of claim 2 wherein the second switch pair includes a third switch for selectively connecting the first input node to the second output node depending on the positive quadrature-phase local oscillator signal and a fourth switch for selectively connecting the first input node to the second output node depending on the negative quadrature-phase local oscillator signal.

5. The passive harmonic switch mixer of claim 2 wherein the third switch pair includes a fifth switch for selectively connecting the second input node to the first output node depending on the positive quadrature-phase local oscillator signal and a sixth switch for selectively connecting the second input node to the first output node depending on the negative quadrature-phase local oscillator signal.

6. The passive harmonic switch mixer of claim 2 wherein the fourth switch pair includes a seventh switch for selectively connecting the second input node to the second output node depending on the positive in-phase local oscillator signal and an eighth switch for selectively connecting the second input node to the second output node depending on the negative in-phase local oscillator signal.

7. The passive harmonic switch mixer of claim 1 wherein each switch of the first, the second, the third, and the fourth switch pairs is a MOS transistor.

8. The passive harmonic switch mixer of claim 1 wherein each switch of the first, the second, the third, and the fourth switch pairs is a BJT transistor.

9. The passive harmonic switch mixer of claim 1 set in a super heterodyne receiver.

10. The passive harmonic switch mixer of claim 1 set in a super heterodyne transmitter.

11. The passive harmonic switch mixer of claim 1 set in a direct conversion transmitter.

12. The passive harmonic switch mixer of claim 1 set in a direct conversion receiver.

13. The passive harmonic switch mixer of claim 1 wherein the differential RF signal includes a positive RF signal and a negative RF signal.

14. The passive harmonic switch mixer of claim 1 wherein the differential baseband signal includes a positive baseband signal and a negative baseband signal.

15. The passive harmonic switch mixer of claim 1 wherein the mixer further includes a first capacitor connected to the first input node and a second capacitor connected to the second input node for DC isolation.

16. A direct conversion receiver for outputting a differential baseband signal including a positive baseband signal and a negative baseband signal according to a differential RF signal including a positive RF signal and a negative RF signal, comprising:

an RF amplifier for amplifying the differential RF signal and outputting an amplified differential RF signal;

a local oscillator for outputting an in-phase differential local oscillator signal including a positive in-phase local oscillator signal and a negative in-phase local oscillator signal;

a phase generator for outputting a first in-phase differential local oscillator signal including a first positive in-phase local oscillator signal and a first negative in-phase local oscillator signal and a first quadrature-phase differential local oscillator signal including a first positive quadrature-phase local oscillator signal and a first negative quadrature-phase local oscillator signal according to the in-phase differential local oscillator signal, wherein the frequency of each of the in-phase differential local oscillator signal and the quadrature-phase differential local oscillator signal is half of the frequency of the differential RF signal, and the phase of the in-phase differential local oscillator signal and that of the quadrature-phase differential local oscillator signal are shifted by 90 degrees;

a phase shifter for outputting a second in-phase differential local oscillator signal including a second positive in-phase local oscillator signal and a second negative in-phase local oscillator signal and a second quadrature-phase differential local oscillator signal including a second positive quadrature-phase local oscillator signal and a second negative quadrature-phase local oscillator signal according to the in-phase differential local oscillator signal by shifting the phase of the corresponding local oscillator signals by 45 degrees;

a first passive harmonic mixer for outputting the in-phase differential baseband signal from a first output node and a second output node according to the amplified differential RF signal received from a first input node and a second input node, wherein the first passive harmonic mixer comprises:

a first switch pair including a first switch for selectively connecting the first input node to the first output node depending on the first positive in-phase local oscillator signal and a second switch for selectively connecting the first input node to the first output node depending on the first negative in-phase local oscillator signal;

a second switch pair including a third switch for selectively connecting the first input node to the second output node depending on the first positive quadrature-phase local oscillator signal and a fourth switch for selectively connecting the first input node to the second output node depending on the first negative quadrature-phase local oscillator signal;

a third switch pair including a fifth switch for selectively connecting the second input node to the first output node depending on the first positive quadrature-phase local oscillator signal and a sixth switch for selectively connecting the second input node to the first output node depending on the first negative quadrature-phase local oscillator signal; and a fourth switch pair including a seventh switch for selectively connecting the second input node to the second output node depending on the first positive in-phase local oscillator signal and a eighth switch for selectively connecting the second input node to the second output node depending on the first negative in-phase local oscillator signal; and a second passive harmonic mixer for outputting the quadrature-phase differential baseband signal from a third output node and a fourth output node according to the amplified differential RF signal received from a third input node and a fourth input node, comprising;

a fifth switch pair including a ninth switch for selectively connecting the third input node to the third output node depending on the second positive in-phase local oscillator signal and a tenth switch for selectively connecting the third input node to the third output node depending on the second negative in-phase local oscillator signal;

a sixth switch pair including an eleventh switch for selectively connecting the third input node to the fourth output node depending on the second positive quadrature-phase local oscillator signal and a twelfth switch for selectively connecting the third input node to the fourth output-node depending on the second negative quadrature-phase local oscillator signal;

a seventh switch pair including a thirteenth switch for selectively connecting the fourth input node to the third output node depending on the second positive quadrature-phase local oscillator signal and a fourteenth switch for selectively connecting the fourth input node to the third output node depending on the second negative quadrature-phase local oscillator signal; and an eighth switch pair including a fifteenth switch for selectively connecting the fourth input node to the fourth output node depending on the second positive in-phase local oscillator signal and a sixteenth switch for selectively connecting the fourth input node to the fourth output node depending on the second negative in-phase local oscillator signal.

17. The passive harmonic switch mixer of claim 16 wherein each switch of the first, the second, the third, the fourth switch, the fifth, the sixth, the seventh, and the eighth switch pairs is a MOS transistor.

18. The passive harmonic switch mixer of claim 16 wherein the mixer further includes a first capacitor connected to the first input node and a second capacitor connected to the second input node for DC isolation.

* * * * *